US011018665B2

(12) United States Patent
Ueda et al.

(10) Patent No.: US 11,018,665 B2
(45) Date of Patent: May 25, 2021

(54) ELECTRONIC CONTROL DEVICE

(71) Applicant: Mitsubishi Electric Corporation, Tokyo (JP)

(72) Inventors: Koji Ueda, Tokyo (JP); Hiroshi Mizukami, Tokyo (JP); Hisanori Nobe, Tokyo (JP); Yoshiyuki Sera, Tokyo (JP); Tom Ikeda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 423 days.

(21) Appl. No.: 16/029,157

(22) Filed: Jul. 6, 2018

(65) Prior Publication Data

US 2019/0305770 A1 Oct. 3, 2019

(30) Foreign Application Priority Data

Apr. 3, 2018 (JP) .............................. JP2018-071328

(51) Int. Cl.
*H03K 17/60* (2006.01)
*F02D 41/22* (2006.01)
*F02D 41/04* (2006.01)

(52) U.S. Cl.
CPC ........... *H03K 17/60* (2013.01); *F02D 41/042* (2013.01); *F02D 41/222* (2013.01); *F02D 2041/228* (2013.01)

(58) Field of Classification Search
CPC ...... H03K 17/60; F02D 41/042; F02D 41/222
See application file for complete search history.

(56) References Cited

FOREIGN PATENT DOCUMENTS

| JP | 64-018532 U | 1/1989 |
| JP | 01221816 A | 9/1989 |
| JP | 08-106834 A | 4/1996 |
| JP | 2013220778 A | 10/2013 |

OTHER PUBLICATIONS

Notification of Reasons for Refusal dated Dec. 18, 2018 from the Japanese Patent Office in application No. 2018-071328.

*Primary Examiner* — John W Poos
(74) *Attorney, Agent, or Firm* — Sughrue Mion, PLLC; Richard C. Turner

(57) ABSTRACT

An electronic control device includes a first pull-up resistor connected between a power supply and a switch, a series circuit of a transistor and a second pull-up resistor with a resistance value lower than that of the first pull-up resistor, connected in parallel with the first pull-up resistor, and a microcomputer, an output port of which is connected to a base terminal of the transistor and which controls a turning on and off of the transistor using a signal output from the output port. A connection point of the switch, the first pull-up resistor, and the second pull-up resistor is connected to a first analog measurement port of the microcomputer, a power supply is connected to a second analog measurement port of the microcomputer, and current flowing into the switch is detected using a value of voltage input into the first analog measurement port.

13 Claims, 5 Drawing Sheets

ELECTRONIC CONTROL DEVICE

BACKGROUND OF THE INVENTION

Field of the Invention

The present invention relates to an electronic control device including a function of detecting a state of a switch mounted in a two-wheeled vehicle or the like.

Description of the Related Art

A two-wheeled vehicle includes an electronic control device (hereafter called an ECU) having a computer system such as a microcomputer. This kind of ECU includes a large number of switch input units. A two-wheeled vehicle commonly has no roof, and a switch may be exposed to rain. When the switch is exposed to rain, there is a case where a leakage current flows even the switch is in an off-state. When adopting a waterproofed switch, no leakage current flows, but employment of a waterproofed switch in a two-wheeled vehicle is rare due to leading to an increase in cost. Because of this, a switch input circuit side of the ECU responds so that there is no erroneous determination, even when a switch is exposed to rain and a leakage current occurs.

To date, a resistance value of a pull-up resistor in an interior of the ECU has been reduced in order that there is no erroneous determination even when a leakage current flows. However, when the resistance value of the pull-up resistor is reduced, current consumption increases, because of which heat generated increases, and it is necessary to use a large-sized pull-up resistor capable of withstanding a high power consumption.

As a method of reducing current consumption, there is a method disclosed in, for example, Patent Document 1 or Patent Document 2. The method disclosed in Patent Document 1 or Patent Document 2 is such that the resistance value of the pull-up resistor is set high. Further, a setting is such that a transistor and a resistor of a low resistance value are connected in parallel with the pull-up resistor, and the transistor can be turned on and off from the microcomputer. Normally, the transistor is in an off-state.

When input into the microcomputer is at a high level, it is determined that a switch is turned off. However, when input into the microcomputer is at a low level, it cannot be determined whether the switch is turned on or whether a leakage current is flowing into the switch. In order to determine this, the transistor is turned on, and the input is pulled up in the resistor with the low resistance value by the transistor being turned on. When the switch is in an on-state, the input into the microcomputer remains at the low level, because of which it is determined that the switch is turned on. When the switch is in an off-state but a leakage current is flowing, the input into the microcomputer changes to the high level, and it is determined that the switch is turned off.

Patent Document 1: Japanese Examined Utility Model Application Publication No. 64-18532

Patent Document 2: JP-A-8-106834

However, the existing switch input circuit disclosed in Patent Document 1 or Patent Document 2 is such that although an erroneous determination can be prevented when a leakage current flows, there is a problem in that to what extent a leakage current is flowing cannot be detected.

SUMMARY OF THE INVENTION

The invention, having been contrived in order to resolve the problem with the previously described kind of existing device, has an object of providing an electronic control device including a switch circuit that can detect an extent of a current flowing into a switch.

An electronic control device disclosed in the invention is characterized by including a first pull-up resistor connected between a power supply and a switch, a series circuit of a transistor and a second pull-up resistor with a resistance value lower than that of the first pull-up resistor, connected in parallel with the first pull-up resistor, and a microcomputer, an output port of which is connected to a base terminal of the transistor and which controls a turning on and off of the transistor using a signal output from the output port, wherein a connection point of the switch, the first pull-up resistor, and the second pull-up resistor is connected to a first analog measurement port of the microcomputer, a power supply is connected to a second analog measurement port of the microcomputer, and current flowing into the switch is detected using a value of voltage input into the first analog measurement port.

According to the electronic control device disclosed in the invention, an erroneous determination is prevented when current flows into a switch, and what degree of current is flowing can be detected.

The foregoing and other objects, characteristics, aspects, and advantages of the invention will become more apparent from the following detailed description of the invention when taken in conjunction with the accompanying drawings.

DETAILED DESCRIPTION OF THE PREFERRED EMBODIMENTS

Figure 1:
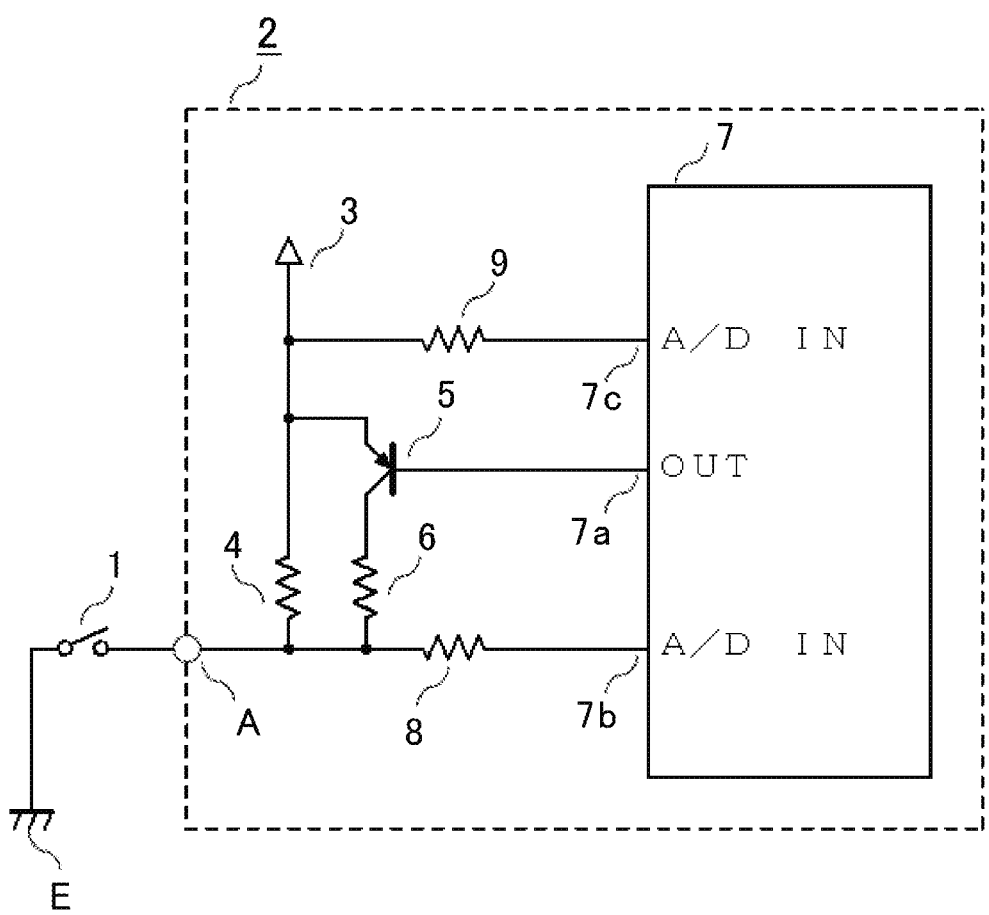
FIG. 1 is a switch circuit diagram of an electronic control device according to a first embodiment.

Hereafter, an electronic control device according to embodiments of the invention will be described, with reference to the drawings. In the drawings, identical reference signs indicate identical or corresponding portions. Also, each drawing shows components necessary in order to describe the relevant embodiment, but does not necessarily show all actual components.

First Embodiment

Hereafter, an electronic control device according to a first embodiment of the invention, in particular a switch circuit thereof, will be described based on drawings.

FIG. 1 is a drawing illustrating the switch circuit of the electronic control device according to the first embodiment. A switch 1 is such that one end is connected to a ground E, and another end is connected to a switch circuit of an ECU 2. The switch circuit of the ECU 2 includes a first pull-up resistor 4 connected between a power supply 3 and the switch 1, and a series circuit of a transistor 5 and a second pull-up resistor 6 connected in parallel with the first pull-up resistor 4. The first pull-up resistor 4 has a higher resistance value than the second pull-up resistor 6, that is, the first pull-up resistor 4 has a high resistance value, and the second pull-up resistor 6 is configured to have a low resistance value.

The transistor 5 is configured so that a base terminal is connected to an output port 7a of a microcomputer 7, and the transistor 5 is controlled so as to be turned on and off by a signal output from the microcomputer 7. Connection is such that voltage of a connection point A of the switch 1, the first pull-up resistor 4, and the second pull-up resistor 6 is input via a first protective resistor 8 into a first analog measurement port 7b of the microcomputer 7. Also, the power supply 3 of the ECU 2 is connected via a second protective resistor 9 to a second analog measurement port 7c of the microcomputer 7.

The switch circuit of the electronic control device according to the first embodiment is configured as previously described, and next, an operation thereof will be described.

Figure 2:
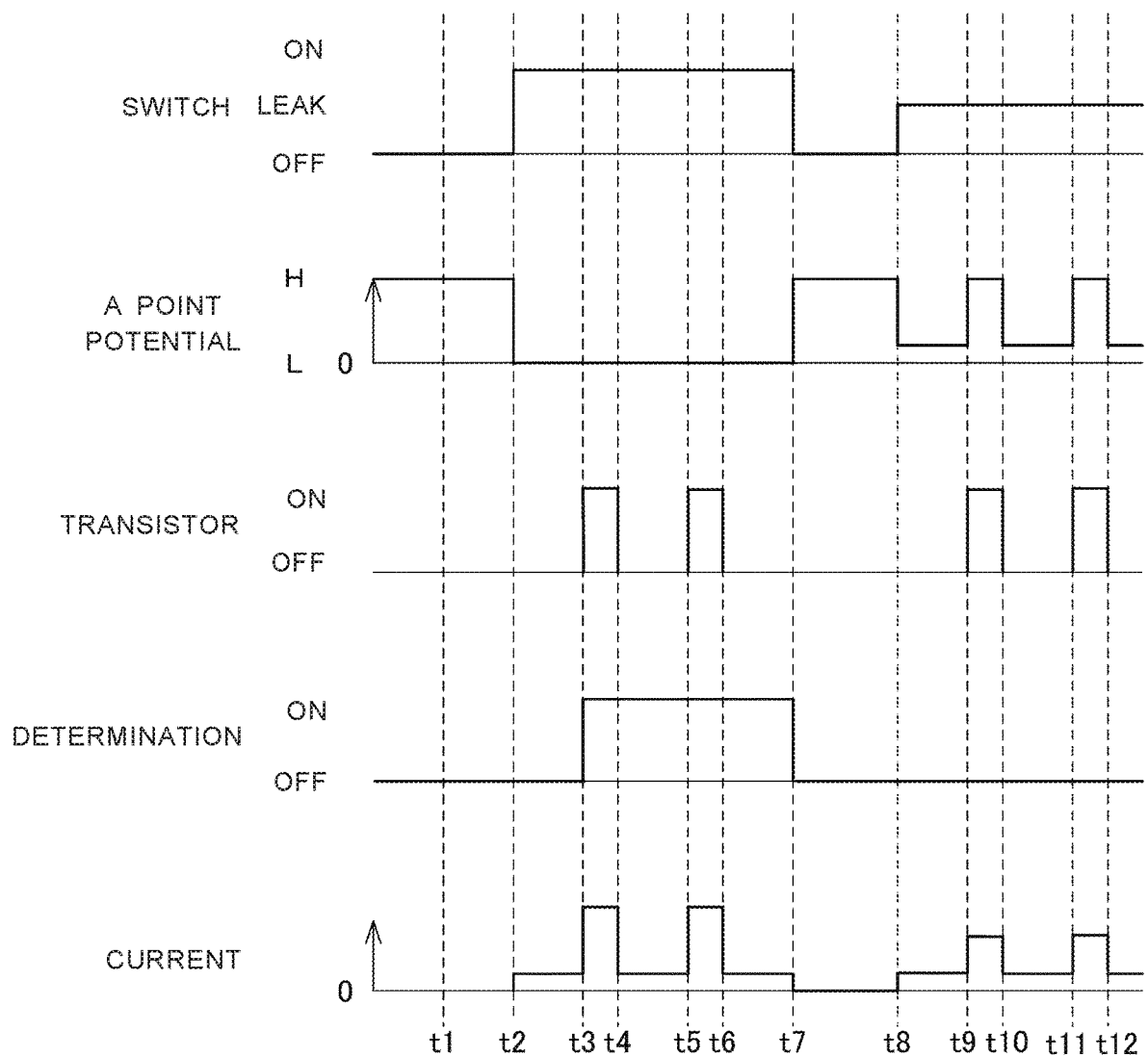
FIG. 2 is a timing chart of a circuit operation of FIG. 1.
Figure 3:
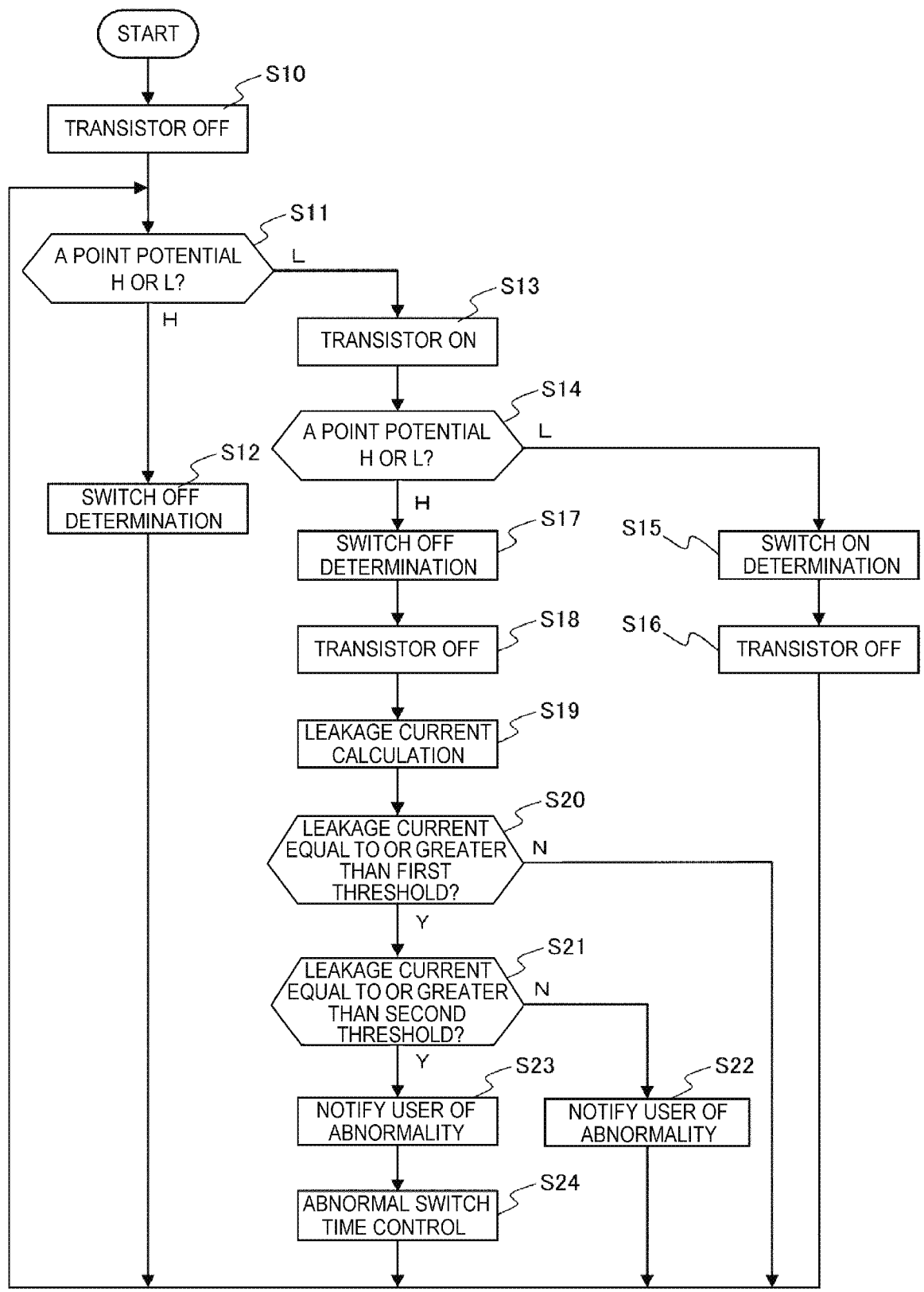
FIG. 3 is a flowchart of the circuit operation of FIG. 1.

FIG. 2 is an operation timing chart of the electronic control device according to the first embodiment, and FIG. 3 is a flowchart.

In FIG. 2 and FIG. 3, a time t1 is a state immediately after the power supply of the ECU 2 is started up. The output port 7a of the microcomputer 7 is set so that the transistor 5 is turned off (step S10). The switch 1 is in an off-state. At this time, the voltage of the connection point A is at a high level (step S11), and a determination by the microcomputer 7 is also that the switch 1 is in an off-state (step S12).

When the switch 1 changes to an on-state at a time t2, the voltage of the connection point A changes from the high level to a low level (step S11). The transistor 5 is turned on by the output port 7a of the microcomputer 7 being changed at a time t3 (step S13), whereby a pulling-up is carried out in the second pull-up resistor 6, which has a low resistance value. When the switch 1 is in an on-state, the voltage of the connection point A remains at the low level (step S14), and a determination is that the switch 1 is in an on-state (step S15). The transistor 5 is turned off again at a time t4 (step S16). From a time t5 onward, determination is carried out by the transistor 5 being turned on and off cyclically, as at the time t3 and the time t4, provided that the connection point A is in a low level state. By the transistor 5 being turned on cyclically, current consumption can be reduced.

When the switch 1 changes to an off-state at a time t7, the voltage of the connection point A changes to the high level (step S11), and the determination is also that the switch 1 is in an off-state (step S12). Provided that the voltage of the connection point A is at the high level, the transistor 5 is not turned on.

When a leak occurs in the switch 1 at a time t8, the voltage of the connection point A changes from the high level to the low level (step S11). The transistor 5 is turned on by the output port 7a of the microcomputer 7 being changed at a time t9, whereby a pulling-up is carried out in the second pull-up resistor 6, which has a low resistance value (step S13).

When a leakage current is occurring, the voltage of the connection point A is at the high level, and the determination remains that the switch 1 is in an off-state (step S17). The transistor 5 is turned off again at a time t10 (step S18). An amount of leakage is calculated from the voltage value of the connection point A when the transistor 5 is turned off (step S19).

From a time t11 onward, determination is carried out by the transistor 5 being turned on and off cyclically, as at the time t9 and the time t10, provided that the connection point A is in a low level state.

The leakage current can be approximately calculated using the equation below. When calculating the leakage current, the voltage of the connection point A when the transistor 5 is in an off-state and the voltage of the power supply 3 of the ECU 2 are calculated, and the leakage current is calculated from the values thereof.

Leakage current=(ECU power supply voltage−connection point A voltage)/(first pull-up resistor 4 resistance value)

A degree of deterioration of the switch 1 can be determined from the value of the leakage current. The value of the leakage current is compared with a first threshold (step S20), and when the value of the leakage current is greater than the first threshold, the value of the leakage current is compared with a second threshold (step S21). Even when the value of the leakage current is smaller than the second threshold, the value of the leakage current is greater than the first threshold, and it is considered that deterioration of the switch 1 is advancing, because of which a user is notified (step S22). Owing to this notification, the user can take measures such as a replacement of the switch 1 before the switch 1 becomes completely unusable.

When the value of the leakage current is greater than the second threshold in step S21, the user is notified (step S23), and abnormal switch time control, such as controlling so as to stop an engine, is implemented so as to maintain a safe state by carrying out control ignoring the state of the switch 1, thereby preventing a dangerous state being caused by an erroneous determination of the state of the switch 1 (step S24).

When the abnormal switch time control involves stopping the engine, a vehicle cannot move. Because of this, determination is implemented in two stages, those being the first threshold and the second threshold, whereby the user can take the vehicle to a dealer or the like, and implement a replacement of the switch 1, before the vehicle becomes unable to move.

Herein, the microcomputer 7 is configured so as to be able to change the first threshold or the second threshold by learning the voltage of the power supply 3.

When the voltage changes to a high level owing to the transistor 5 being turned on, there is a case in which the switch 1 is turned off but current is leaking due to the switch 1 being exposed to water, or the like, in addition to which there is a case in which the switch 1 is turned on, but is conducting with a resistance value that cannot be ignored due to an oxide film being formed on a contact of the switch 1.

For example, when the switch 1 is a starter switch, there is a danger of the engine starting without the user intending so when the switch 1 is erroneously determined to be turned on despite being turned off. Conversely, the engine cannot start when the switch 1 is erroneously determined to be turned off despite being turned on.

This embodiment is such that, owing to the series circuit of the transistor 5 and the second pull-up resistor 6, which has a low resistance value, determination of whether the switch 1 is turned on or off can be carried out normally even when a leakage current or an oxide film occurs in the switch 1. Also, by a value that is a value of current flowing into the switch 1 converted into voltage by the first pull-up resistor 4, which has a high resistance value, being input into the first analog measurement port 7b of the microcomputer 7, and the degree of deterioration of the contact of the switch 1 due to a leakage current or an oxide film being detected, a deterioration in reliability of the contact of the switch 1 is determined, and control that averts danger, such as not allowing the engine to start, can be carried out.

Also, although not shown, the user can be notified by displaying a warning on an indicator such as a meter, or the like, by a deterioration state being output as an error.

For example, when the switch 1 is a side stand switch of a two-wheeled vehicle, there is a danger of the vehicle starting to move with the side stand still projecting when the side stand is erroneously determined to be housed despite the side stand projecting. In this kind of case too, an erroneous evaluation of the switch 1 can be prevented. Also, the user can be notified in accordance with the degree of deterioration of the switch 1, and control that averts danger, such as stopping the engine, can be carried out.

Second Embodiment

Figure 4:
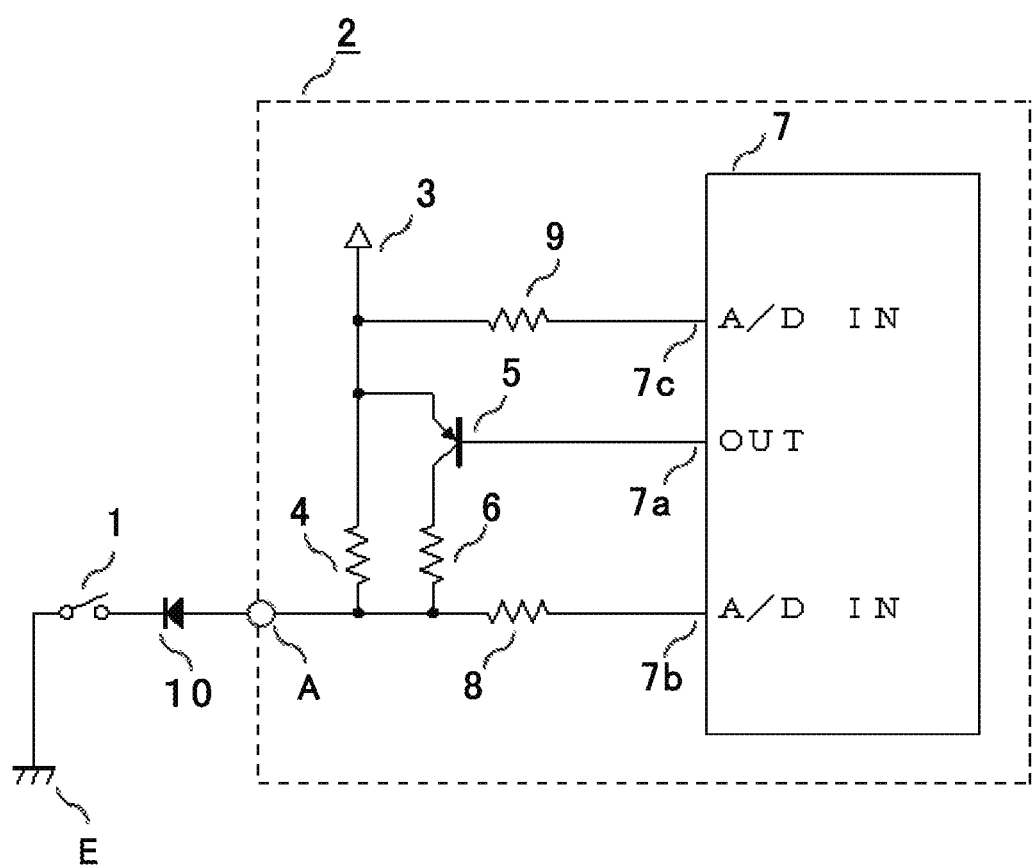
FIG. 4 is a switch circuit diagram of an electronic control device according to a second embodiment.

Next, an electronic control device according to a second embodiment, in particular a switch circuit thereof, will be described. FIG. 4 is a switch circuit diagram of the electronic control device according to the second embodiment.

An on/off threshold or an amount of leakage such that the user is to be notified, or an amount of leakage such that control such as not allowing the engine to start is to be carried out, varies depending on the switch or an external circuit.

For example, when a diode 10 is connected to the switch 1, as in FIG. 4, a potential of the point A when the switch 1 is turned on due to an effect of a forward voltage of the diode 10 rises by an amount equivalent to the forward voltage of the diode 10, because of which a threshold also needs to be set taking the effect of the forward voltage into consideration. In the second embodiment, a configuration is such that a threshold can be arbitrarily set by program setting data of the microcomputer 7 being changed, and there is no need for a circuit constant to be changed in accordance with the switch 1 or the external circuit.

The switch circuit of the electronic control device according to the second embodiment is such that, as previously described, a threshold is set by the program of the microcomputer 7, because of which the threshold can be changed by learning.

When a battery deteriorates and the voltage of the power supply 3 of the ECU 2 drops, it is better that the on/off setting threshold of the switch 1 is set low in accordance with the drop of the power supply voltage. As the voltage of the power supply 3 is measured in the microcomputer 7, the voltage drop of the power supply 3 can be detected. By the threshold also being reduced in accompaniment to the voltage drop of the power supply 3, an accurate determination can be implemented.

For example, it is taken that the threshold is set assuming a power supply voltage of 14V. When the power supply voltage is 10V, the threshold is changed in accordance with the following equation.

Power supply voltage 10V threshold=power supply voltage 14V threshold×$10/14$

Third Embodiment

Figure 5:
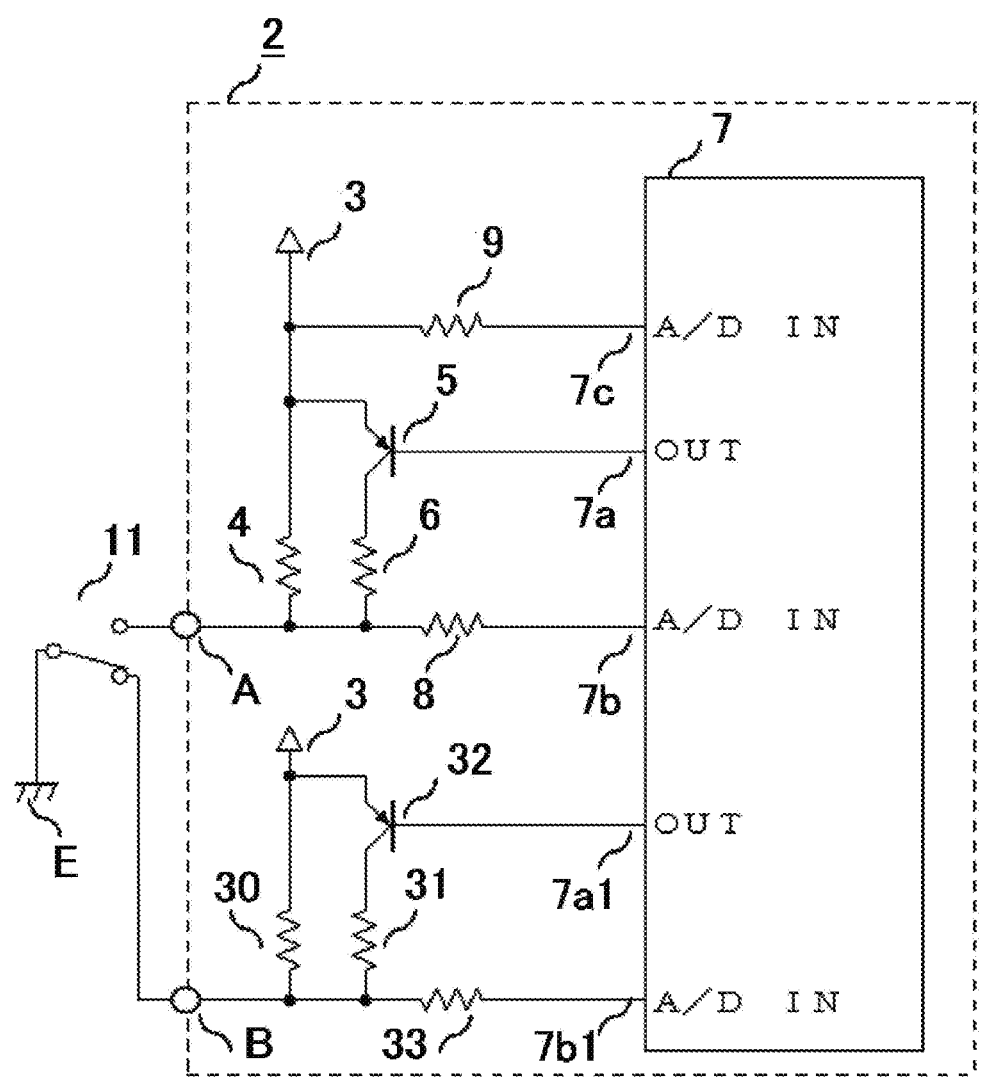
FIG. 5 is a switch circuit diagram of an electronic control device according to a third embodiment.

Next, an electronic control device according to a third embodiment, in particular a switch circuit thereof, will be described. FIG. 5 is a switch circuit diagram of the electronic control device according to the third embodiment.

The third embodiment shows a case in which a switch 11 is a three-way switch. A connection point A side of the switch 11 is in an off-state, and a connection point B side is in an on-state. When a leak occurs in the switch 11, the leak can be detected because the connection point A side is in an off-state. As the connection point B side is in an on-state, however, the leak cannot be detected unless the switch 11 is in an off-state. In this kind of case, as the same switch 11 is also connected to the connection point B side, it is determined in the same way that the reliability of the switch 11 is decreasing noticeably, and control that averts danger can be carried out.

The electronic control device according to the third embodiment is such that a third pull-up resistor 30, a fourth pull-up resistor 31, a second transistor 32, and a third protective resistor 33 are provided in the ECU 2, as shown in FIG. 5. The third pull-up resistor 30, the fourth pull-up resistor 31, the second transistor 32, and the third protective resistor 33 form the same kind of circuit configuration with respect to the power supply 3 as the first pull-up resistor 4, the second pull-up resistor 6, the transistor 5, and the first protective resistor 8. Also, a second output port 7$a$1 and a third analog measurement port 7$b$1 are provided in the microcomputer 7. A base terminal of the second transistor 32 is connected to the second output port 7$a$1. Also, voltage of the connection point B of the switch 11, the third pull-up resistor 30, and the fourth pull-up resistor 31 is input via the third protective resistor 33 into the third analog measurement port 7$b$1.

Although exemplifying embodiments are described in the disclosure, various characteristics, aspects, and functions described in one or a multiple of embodiments, not being limited to application to a specific embodiment, can be applied to the embodiments singly or in various combinations. Consequently, a countless number of undescribed modified examples are envisaged within the range of the technology disclosed in the invention. For example, a case in which at least one component is modified, added, or eliminated, and furthermore, a case in which at least one component is extracted and combined with a component of another embodiment, are included.

To give a specific example, a configuration wherein one end of the switch 1 or the switch 11 is connected to the ground and the other end is connected to the ECU 2 is described in the embodiments, but it goes without saying that the same advantages are obtained by one end being connected to a power supply and the other end being connected to the ECU 2.

Various modifications and alterations of this invention will be apparent to those skilled in the art without departing from the scope and spirit of the invention, and it should be understood that this is not limited to the illustrative embodiments set forth herein.

What is claimed is:

1. An electronic control device, comprising:
a first pull-up resistor connected between a power supply and a switch;
a series circuit of a transistor and a second pull-up resistor with a resistance value lower than that of the first pull-up resistor, connected in parallel with the first pull-up resistor; and
a microcomputer, an output port of which is connected to a base terminal of the transistor and which controls a turning on and off of the transistor using a signal output from the output port, wherein
a connection point of the switch, the first pull-up resistor, and the second pull-up resistor is connected to a first analog measurement port of the microcomputer, a power supply is connected to a second analog measurement port of the microcomputer, and the microcomputer:

detects a current flowing into the switch using a first value of a voltage input into the first analog measurement port, and detects a magnitude of a leakage current using a second value of a voltage input to the second analog measurement port.

2. The electronic control device according to claim 1, wherein the microcomputer detects a leakage current flowing into the switch using the value of voltage input into the first analog measurement port.

3. The electronic control device according to claim 1, wherein the microcomputer can set a threshold that distinguishes between a turning on and off of the switch and a leakage current flowing into the switch using the value of voltage input into the first analog measurement port.

4. The electronic control device according to claim 2, wherein the microcomputer can set a threshold that distinguishes between a turning on and off of the switch and a leakage current flowing into the switch using the value of voltage input into the first analog measurement port.

5. The electronic control device according to claim 3, wherein the threshold can be set arbitrarily.

6. The electronic control device according to claim 4, wherein the threshold can be set arbitrarily.

7. The electronic control device according to claim 3, wherein the microcomputer learns a voltage of the power supply, and changes the threshold.

8. The electronic control device according to claim 4, wherein the microcomputer learns a voltage of the power supply, and changes the threshold.

9. The electronic control device according to claim 5, wherein the microcomputer detects the current flowing into the switch based on a resistance value of the second pull-up resistor.

10. The electronic control device according to claim 6, wherein the microcomputer detects the magnitude of the leakage current using a resistance value of the first pull-up resistor.

11. The electronic control device according to claim 2, wherein the microcomputer notifies a user of abnormality of the switch based on the magnitude of the current.

12. The electronic control device according to claim 2, wherein the microcomputer carries out control stopping an engine based on the magnitude of the leakage current.

13. The electronic control device according to claim 11, wherein the microcomputer carries out control stopping an engine based on the magnitude of the leakage current.

\* \* \* \* \*